(12) United States Patent
Je et al.

(10) Patent No.: US 8,705,777 B2
(45) Date of Patent: Apr. 22, 2014

(54) MEMS MICROPHONE AND METHOD OF MANUFACTURING THE SAME

(75) Inventors: Chang Han Je, Daejeon (KR); Jae Woo Lee, Daejeon (KR); Woo Seok Yang, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 29 days.

(21) Appl. No.: 13/601,896

(22) Filed: Aug. 31, 2012

(65) Prior Publication Data

US 2013/0094675 A1   Apr. 18, 2013

(30) Foreign Application Priority Data

Oct. 12, 2011  (KR) .................. 10-2011-0104107

(51) Int. Cl.
*H04R 1/00* (2006.01)
*H04R 31/00* (2006.01)

(52) U.S. Cl.
CPC . *H04R 1/00* (2013.01); *H04R 31/00* (2013.01)
USPC .............................. 381/175; 381/174; 381/191

(58) Field of Classification Search
CPC ........ H04R 1/00; H04R 31/00; B81B 3/0072; B81B 2203/0127
USPC .......... 381/173, 174, 175, 191; 257/416, 254, 257/678, 685, 686; 438/50–53; 367/170, 367/174, 181
See application file for complete search history.

(56) References Cited

U.S. PATENT DOCUMENTS

| 6,535,460 | B2 | 3/2003 | Loeppert et al. | |
| 2004/0259286 | A1* | 12/2004 | Dehe et al. | 438/50 |
| 2010/0135123 | A1 | 6/2010 | Hoechst et al. | |
| 2010/0158281 | A1* | 6/2010 | Lee et al. | 381/175 |
| 2012/0098076 | A1* | 4/2012 | Lee et al. | 257/416 |

FOREIGN PATENT DOCUMENTS

| KR | 10-2009-0054885 A | 6/2009 |
| KR | 10-2010-0073051 A | 7/2010 |

OTHER PUBLICATIONS

Jaewoo Lee et al., "A Surface-Micromachined MEMS Acoustic Sensor with X-shape Bottom Electrode Anchor", IEEE Sensors 2009 Conference, 2009, pp. 1313-1316, IEEE.
Christina Leinenbach et al., "A New Capacitive Type MEMS Microphone", IEEE, 2010, pp. 659-662, IEEE.

* cited by examiner

*Primary Examiner* — Tuan D Nguyen

(57) ABSTRACT

Disclosed are a MEMS microphone and a method of manufacturing the same. The MEMS microphone includes: a substrate; a rear acoustic chamber formed inside a front surface of the substrate; a vibrating plate formed on the substrate and having an exhaust hole; a fixed electrode formed on the vibrating plate; and a fixed electrode support supported by a bottom of the rear acoustic chamber and connected to the fixed electrode through the exhaust hole.

13 Claims, 9 Drawing Sheets

<PRIOR ART>

<PRIOR ART>

MEMS MICROPHONE AND METHOD OF MANUFACTURING THE SAME

CROSS-REFERENCE TO RELATED APPLICATIONS

This application is based on and claims priority from Korean Patent Application No. 10-2011-0104107, filed on Oct. 12, 2011, with the Korean Intellectual Property Office, the disclosure of which is incorporated herein in its entirety by reference.

TECHNICAL FIELD

The present disclosure a MEMS microphone, and more particularly, to a MEMS microphone which can prevent deflection and deformation of the MEMS microphone to improve performance of the MEMS microphone, and a method of manufacturing the same.

BACKGROUND

Micro electro mechanical systems (MEMS) acoustic sensors (also referred to as MEMS microphones) are apparatuses for converting a voice to an electric signal, and the types of MEMS microphones includes a capacitive MEMS microphone and a piezoelectric MEMS microphone. The capacitive MEMS microphone uses a principle of a capacitor where two electrodes face each other, where one electrode is fixed onto a substrate and the other electrode is suspended in the air such that a vibrating plate reacts to an external acoustic pressure so as to be moved. That is, in the capacitive MEMS microphone, when the external acoustic pressure is input, the vibrating plate is vibrated and a capacitance value is changed while a gap between the two electrodes is changed, such that a current flows. Due to its stability and excellent frequency characteristics, such capacitive MEMS microphones are used for most of the existing MEMS microphones.

Meanwhile, in the MEMS microphone according to the related art, a rear acoustic chamber is formed by etching a fixed electrode in the form of a thin film and a lower substrate of the vibrating plate. In this case, the fixed electrode may be deformed, that is, deflected or bent by a residual stress or a pressure (for example, an acoustic pressure, an atmospheric pressure and the like) applied from the outside as an infrastructure supporting the fixed electrode at a lower portion thereof disappears. This may influence a performance of the MEMS microphone, and thus it is necessary to minimize deformation of the fixed electrode. In addition, since the vibrating plate needs to be maximally deformed in spite of an external acoustic pressure and the fixed electrode does not need to be deformed during an operation of the MEMS microphone to obtain high sensitivity, the fixed electrode does not need to be moved while having strength.

FIG. 1 is a view illustrating a structure of a bulk machined MEMS microphone according to the related art. FIG. 2 is a view illustrating a structure a surface machined MEMS microphone having a fixed electrode support structure.

Referring to FIG. 1, a vibrating plate 120 and a fixed electrode 130 are formed on a substrate 110, and a rear acoustic chamber 112 is formed to pass through a rear surface of the substrate 110 through bulk machining (U.S. Pat. No. 6,535,460).

Through this method, the rear acoustic chamber may be relatively simply formed on the rear surface of the substrate through bulk machining, but a fixed electrode support cannot be formed due to a structure which passes through the substrate.

In order to solve the problem, the fixed electrode may be made thick, but when the fixed electrode is made thick, air resistance of an exhaust hole of the fixed electrode increases, thereby deteriorating sensitivity. In addition, as an area of the fixed electrode increases, the fixed electrode becomes weaker to the deformation.

Referring to FIG. 2, a surface machined MEMS microphone structure is formed on a substrate 210, and a fixed electrode support 230 and a rear acoustic chamber 212 are formed by isotropic-etching the substrate 210 through an exhaust hole 222 formed in a lower fixed electrode 220 (IEEE SENSORS Conference 2009).

Unlike the above method, in this method, the fixed electrode support and the rear acoustic chamber are simultaneously formed by partially leaving a substrate functioning as a support under the fixed electrode by using an etching speed difference of the substrate according to the disposition of an exhaust hole.

However, the method is a method of forming the fixed electrode support by using a substrate itself, and can be implemented only when the fixed electrode directly contacts the substrate and cannot be implemented when the fixed electrode is located on the vibrating plate. In addition, if the vibrating plate is located on the fixed electrode, the vibrating plate may be directly exposed and damaged during a process, and may also be damaged due to the vibrating plate due to particles or moisture during an operation.

Thus, in order to protect the vibrating plate to obtain high sensitivity while increasing reliability in the surface machined MEMS microphone, the present disclosure provides a structure where the fixed electrode is disposed on the vibrating plate and the fixed electrode support is installed.

SUMMARY

The present disclosure has been made in an effort to provide a high reliability, high sensitivity MEMS microphone where a fixed electrode is located on a vibrating plate and a fixed electrode support for supporting the fixed electrode is formed in a surface machined MEMS microphone, and a method of manufacturing the same.

An exemplary embodiment of the present disclosure provides a MEMS microphone including: a substrate; a rear acoustic chamber formed inside a front surface of the substrate; a vibrating plate formed on the substrate and having an exhaust hole; a fixed electrode formed on the vibrating plate; and a fixed electrode support supported by a bottom of the rear acoustic chamber and connected to the fixed electrode through the exhaust hole.

Another exemplary embodiment of the present disclosure provides a MEMS microphone including: a substrate; a rear acoustic chamber formed inside a front surface of the substrate; a vibrating plate formed on the substrate and having a plurality of exhaust holes; a fixed electrode formed on the vibrating plate; and a plurality of fixed electrode supports supported by a bottom of the rear acoustic chamber and connected to the fixed electrode through the plurality of exhaust holes.

Yet another exemplary embodiment of the present disclosure provides a method of manufacturing a MEMS microphone, the method including: etching a plurality of side regions of a substrate by a predetermined depth to form a fixed electrode support; burying an etching preventing material in the etched regions to form an etching preventing wall; forming a first sacrificial layer on the substrate; forming a vibrating plate on the first sacrificial layer; forming a second sacrificial layer on the vibrating plate; forming a fixed electrode on the second sacrificial layer; removing the first sacrificial layer and the second sacrificial layer; and etching the substrate under the vibrating plate to form a rear acoustic chamber.

According to the exemplary embodiments of the present disclosure, since the present disclosure provides a MEMS microphone including a fixed electrode located on a vibrating plate and a fixed electrode support for supporting the fixed electrode, and a method of manufacturing the same, it is possible to form the fixed electrode which is wider and thinner, thereby improving a performance of a surface machined MEMS microphone and applying the MEMS microphone to various devices.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings. In a description of the present disclosure, a detailed description of related known configurations and functions will be omitted when it may make the essence of the present disclosure obscure.

Figure 1:
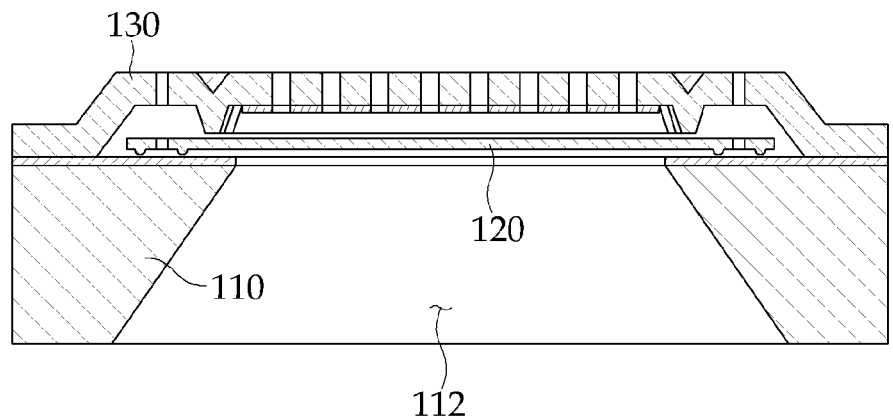
FIG. 1 is a view illustrating a structure of a bulk machined MEMS microphone according to the related art.
Figure 2:
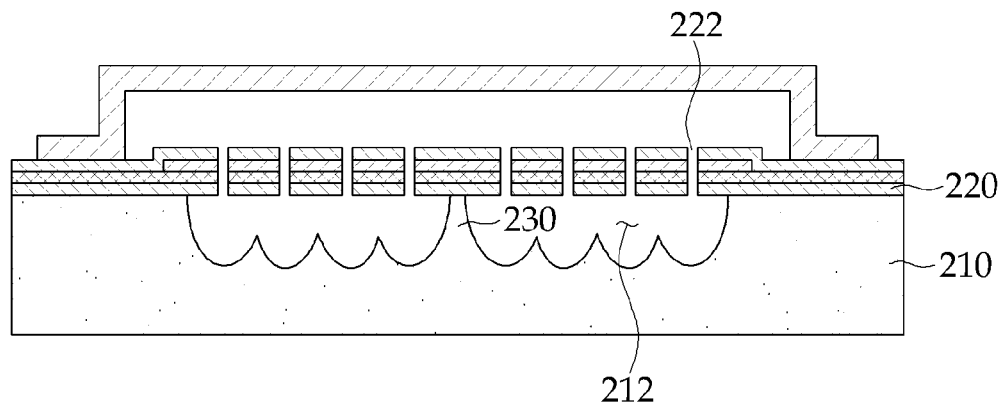
FIG. 2 is a view illustrating a structure a surface machined MEMS microphone having a fixed electrode support structure.
Figure 3:
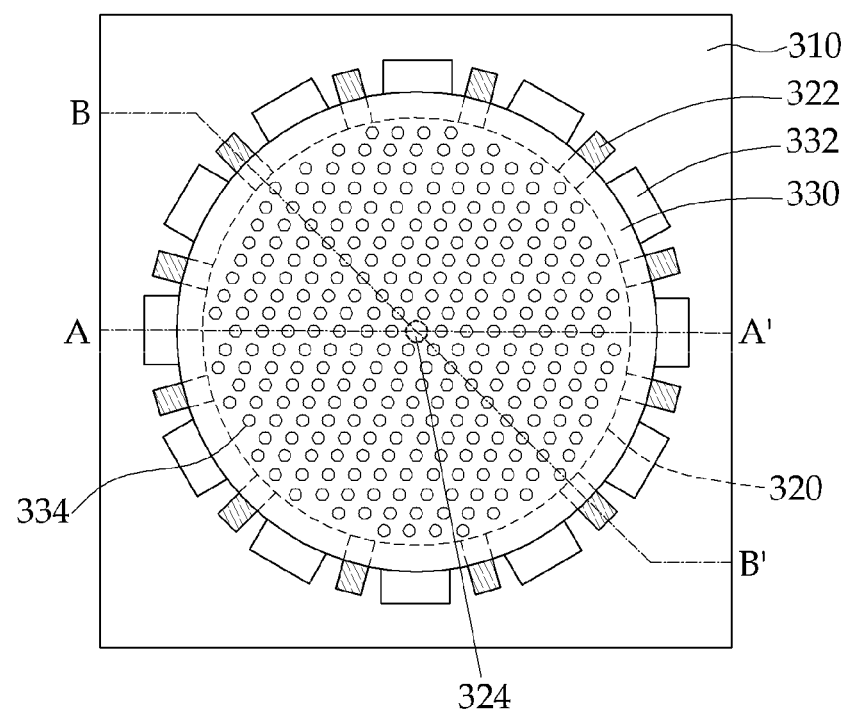
FIG. 3 is a plan view of a MEMS microphone according to a first exemplary embodiment of the present disclosure.
Figure 4:
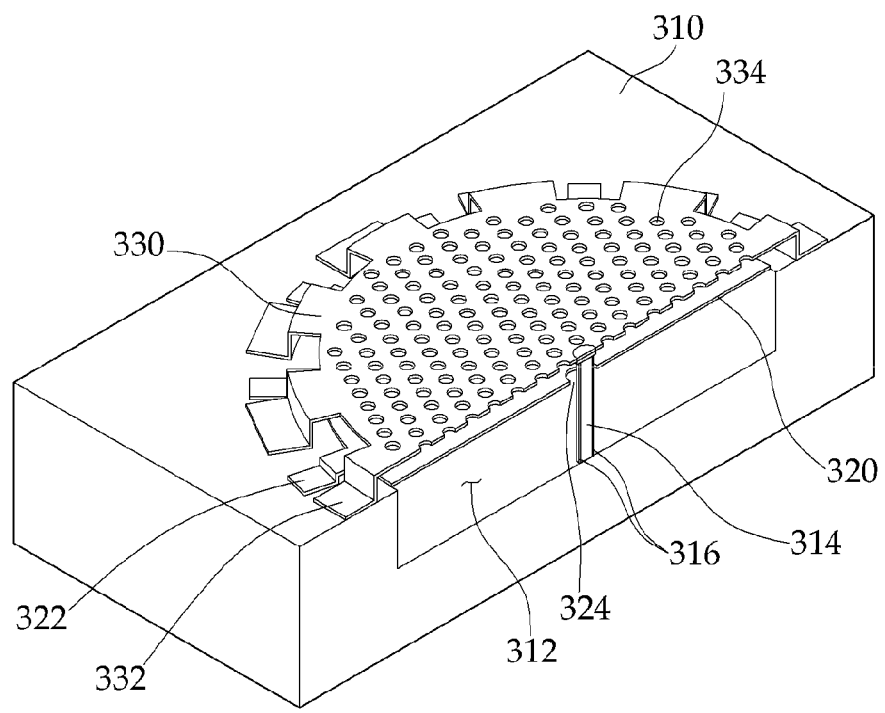
FIG. 4 is a perspective view of the MEMS microphone according to the first exemplary embodiment of the present disclosure.
Figure 5:
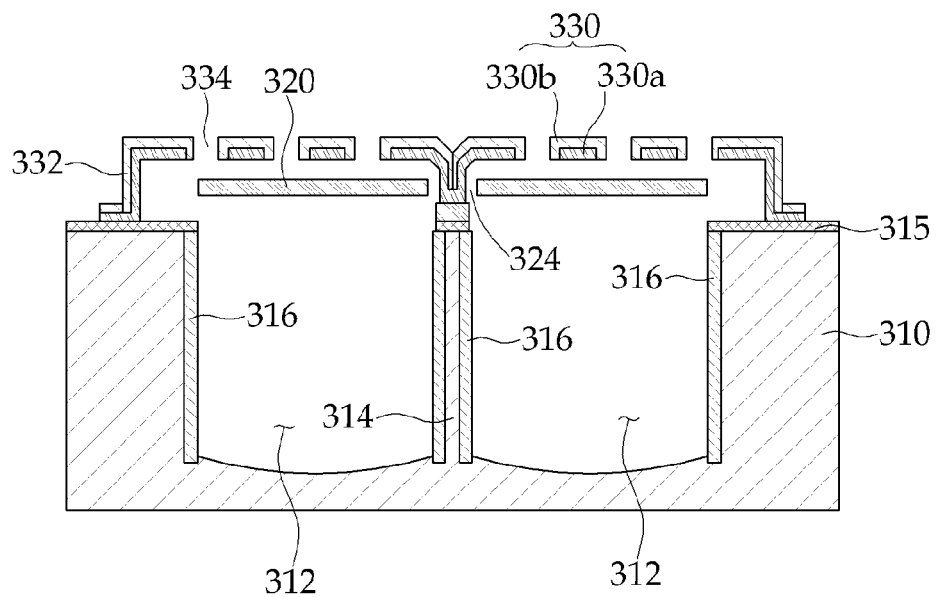
FIG. 5 is a sectional view taken along line A-A' of the MEMS microphone of FIG. 3.
Figure 6:
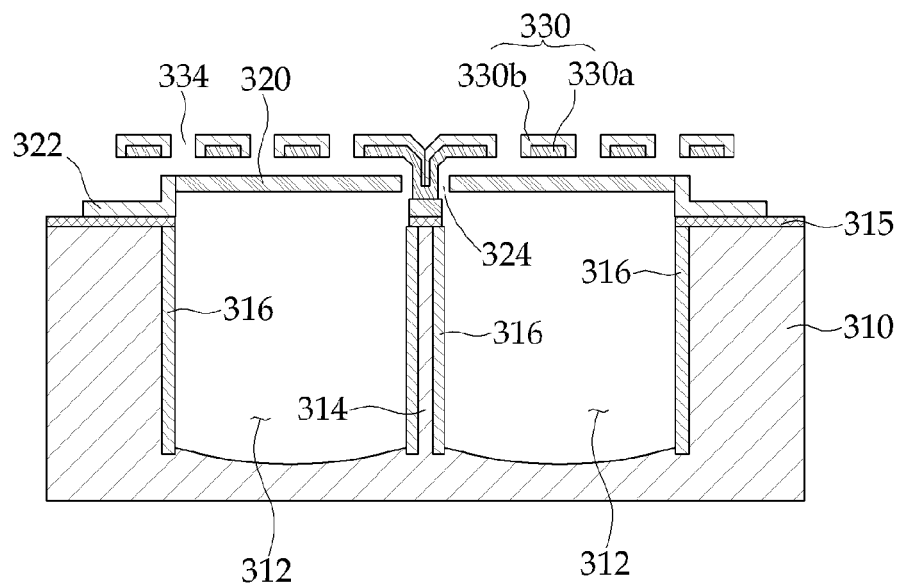
FIG. 6 is a sectional view taken along line B-B' of the MEMS microphone of FIG. 3.

FIG. 3 is a plan view of a MEMS microphone according to a first exemplary embodiment of the present disclosure and FIG. 4 is a perspective view of the MEMS microphone according to the first exemplary embodiment of the present disclosure. FIG. 5 is a sectional view taken along line A-A' of the MEMS microphone of FIG. 3 and FIG. 6 is a sectional view taken along line B-B' of the MEMS microphone of FIG. 3.

Referring to FIGS. 3 to 6, the MEMS microphone according to the first exemplary embodiment includes a substrate 310, a vibrating plate 320, a fixed electrode 330 and the like.

The substrate 310 may be a silicon substrate and the like, and a rear acoustic chamber 312 is formed inside a front surface of the substrate 310.

A fixed electrode support 314 supported by a bottom of the rear acoustic chamber 312 and connected to the fixed electrode 330 through an exhaust hole 324 of the vibrating plate 320 is formed in the substrate 310. Here, etching preventing walls 316 are formed on an outer wall of the fixed electrode support 314 and an inner wall of the rear acoustic chamber 312. The etching preventing walls 316 may be formed by depositing an oxide film, a nitride film, a metal or the like.

The vibrating plate 320 is formed at the same height as that of an upper surface of the substrate, or is formed to be spaced apart from the substrate 310 by a predetermined interval. Here, the vibrating plate 320 is connected to the substrate 310 by using a vibrating plate/substrate connector 322 formed on an outer periphery thereof.

The exhaust hole 324 to which the fixed electrode 330 and the fixed electrode support 314 can be connected is formed at a central portion of the vibrating plate 320. In this case, a diameter of the exhaust hole 324 is larger than a diameter of a cross-section of the fixed electrode support 314, so that exhaust of air through the exhaust hole 324 may not be obstructed while a movement of the vibrating plate 320 is not influenced.

The fixed electrode 330 includes a metal 330$a$ and an insulation film 330$b$, and is formed to be spaced apart from the vibrating plate 320 by a predetermined distance. Here, the fixed electrode 330 is connected to the substrate 310 by using a fixed electrode/substrate connector 332 formed on an outer periphery thereof.

A plurality of exhaust holes 334 for exhausting air are formed in the fixed electrode 330.

Figure 7:
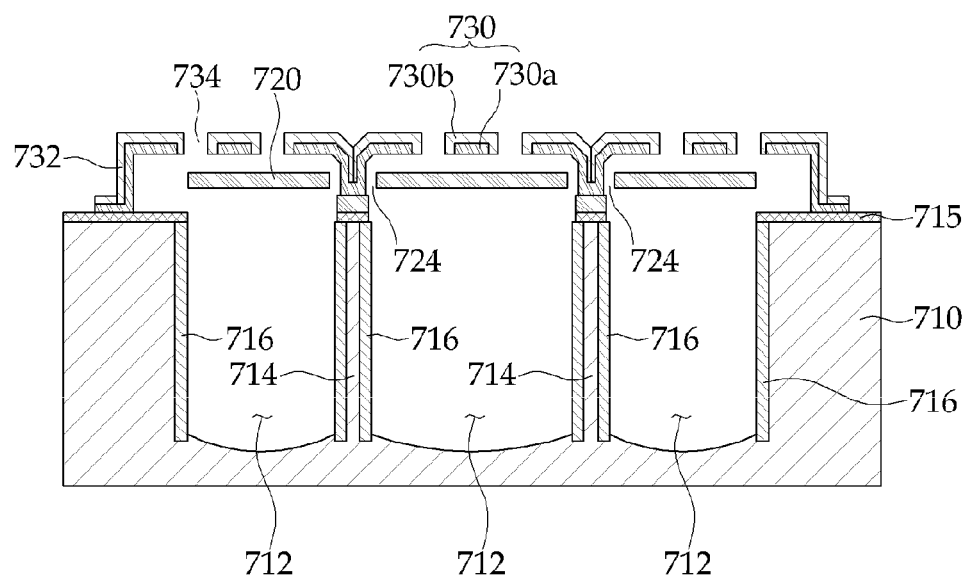
FIG. 7 is a plan view of a MEMS microphone according to a second exemplary embodiment of the present disclosure.

FIG. 7 is a plan view of a MEMS microphone according to a second exemplary embodiment of the present disclosure.

Referring to FIG. 7, the MEMS microphone according to the second exemplary embodiment includes a substrate 710, a vibrating plate 720, a fixed electrode 730 and the like, like the MEMS microphone of FIG. 6.

However, in the MEMS microphone according to the second exemplary embodiment of the present disclosure, a plurality of fixed electrode supports 714, not one fixed electrode support are disposed according to an area and a shape of the fixed electrode 730. Accordingly, a plurality of exhaust holes 724 are preferably also formed in the vibrating plate 720 to correspond to the number of fixed electrode supports 714.

Thus, the MEMS microphone according to the second exemplary embodiment of the present disclosure can more firmly support the fixed electrode 730 by using the plurality of fixing electrode supports 714.

FIGS. 8A to 8K are process flowcharts illustrating a method of manufacturing a MEMS microphone according to the first exemplary embodiment of the present disclosure.

Figure 8A:
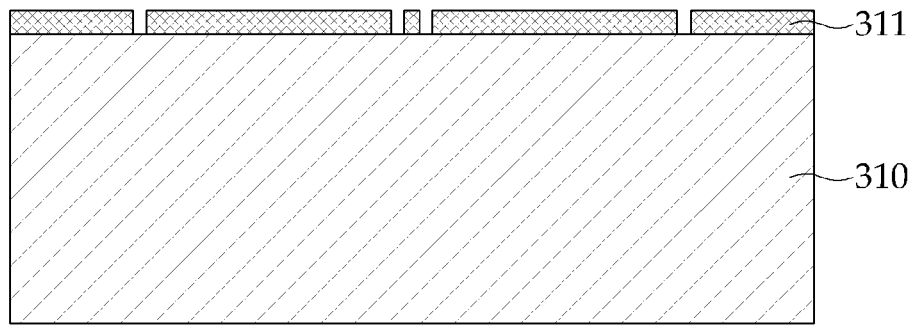
FIGS. 8A to 8K are process flowcharts illustrating a method of manufacturing a MEMS microphone according to the first exemplary embodiment of the present disclosure.

Referring to FIG. 8A, in order to form a below-described fixed electrode support 314 in the substrate 310, after an etching mask 311 for isotropic etching of the substrate 310 is deposited, the etching mask 311 is patterned into a shape where the fixed electrode support 314 is formed.

Figure 8B:
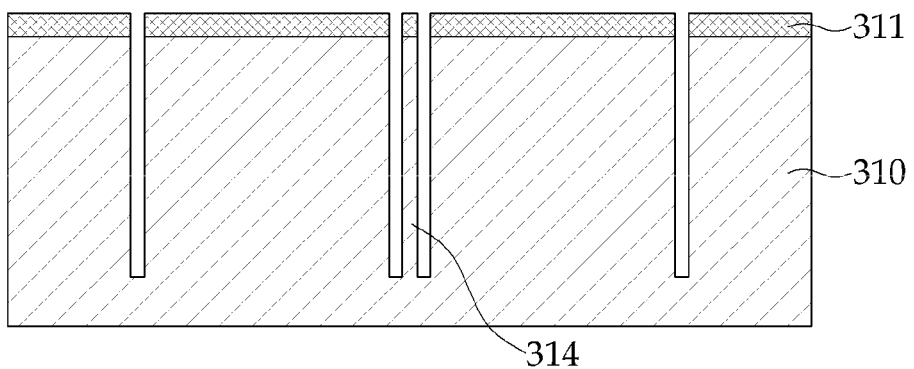

Referring to FIG. 8B, the fixed electrode support 314 is formed by etching the substrate 310 by a height of the fixed electrode support 314 and a depth of a below-described rear acoustic chamber 312 through isotropic etching using the patterned etching mask 311.

Figure 8C:
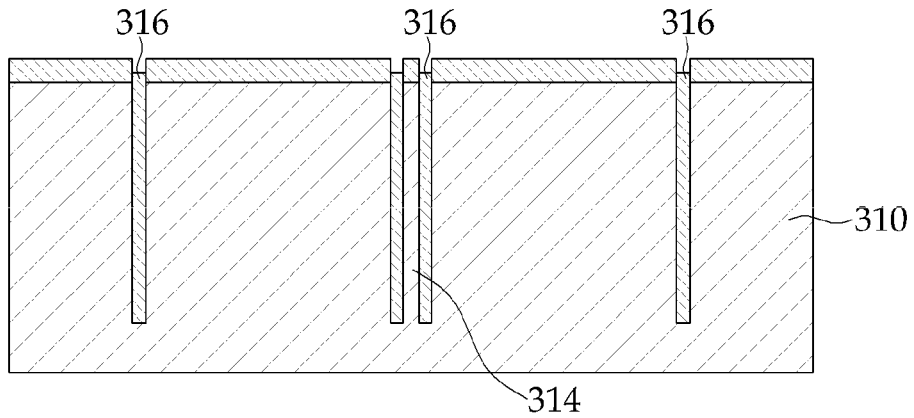

Referring to FIG. 8C, after the patterned etching mask 311 is removed, an etching preventing wall 316 is formed by burying an etching preventing material in the etched region. Here, the etching preventing material may be an oxide film, a nitride film, a metal and the like.

Figure 8D:
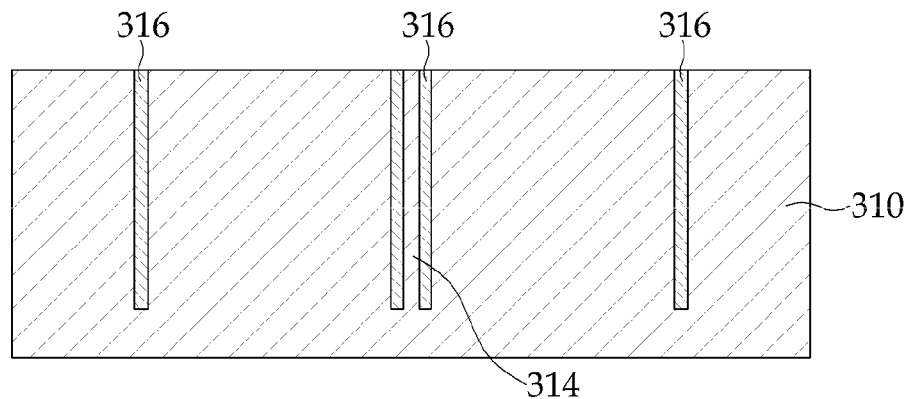

Referring to FIG. 8D, after the etching preventing wall 316 is formed, a surface of the substrate 310 is not flattened and a step is formed at a location where the etching preventing wall 316 is formed as illustrated in FIG. 8C. Since the step may cause a problem during the subsequent CMOS process or MEMS process, a process of flattening the surface of the substrate 310 is performed.

Figure 8E:
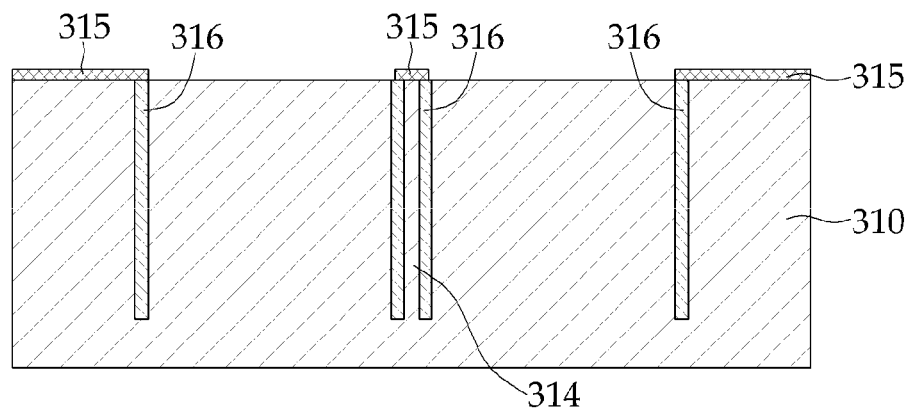

Referring to FIG. 8E, a mask layer 315 for forming a rear acoustic chamber 312 is deposited on the substrate 310, and the mask layer 315 is patterned into a shape where the rear acoustic chamber 312 is formed.

Figure 8F:
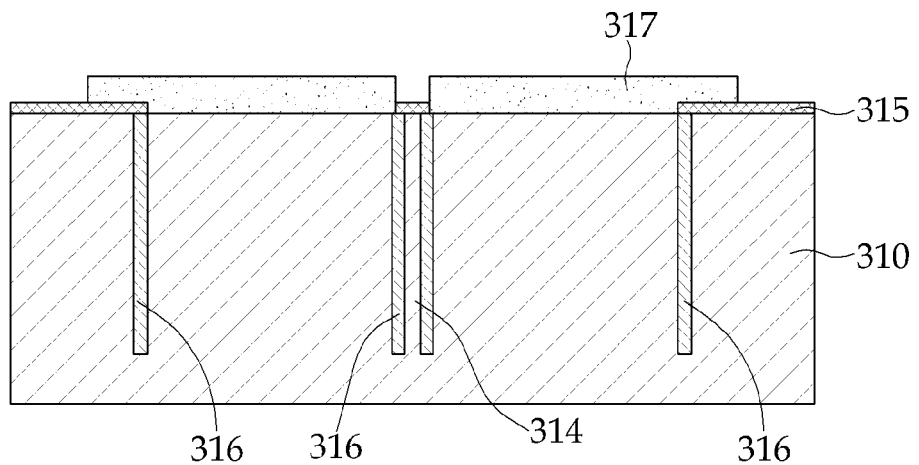

Referring to FIG. 8F, a first sacrificial layer 317 is formed on the substrate 310 where the mask layer 315 is formed, and the first sacrificial layer 317 is patterned such that only a portion where a vibrating plate 320 is to be formed is left.

Figure 8G:
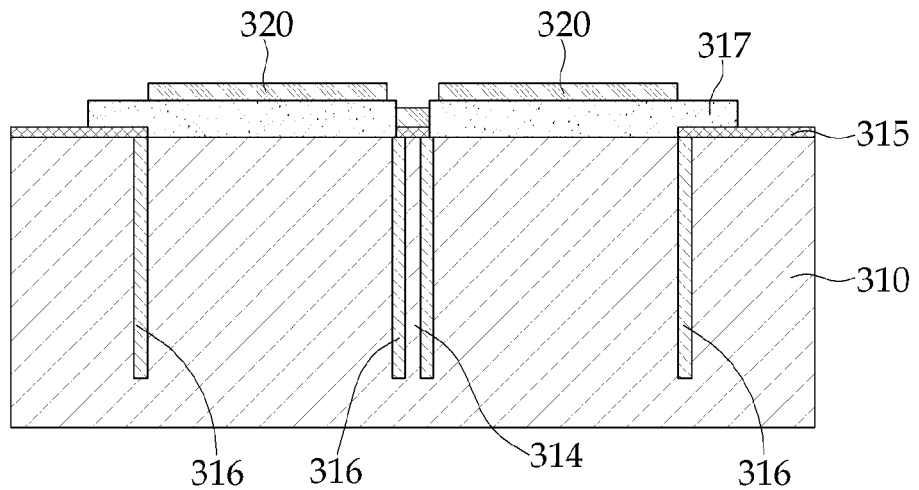

Referring to FIG. 8G, the vibrating plate 320 is formed on the patterned first sacrificial layer 317. In this case, a vibrating plate/substrate connector (not shown) connecting the vibrating plate 320 and the substrate 310 is formed together.

Figure 8H:
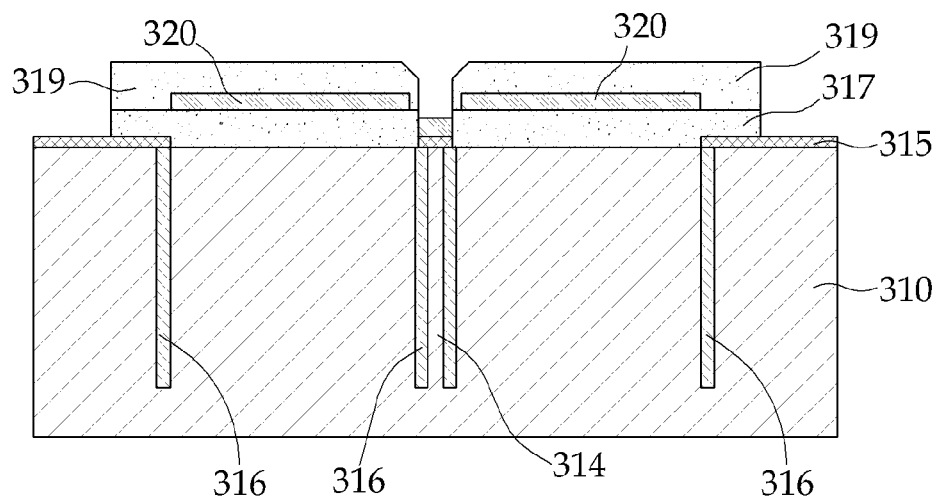

Referring to FIG. 8H, a second sacrificial layer 319 is formed on the substrate 310 where the vibrating plate 320 is formed, and the second sacrificial layer 319 is patterned such that only a portion where a fixed electrode 330 is to be formed is left.

Figure 8I:
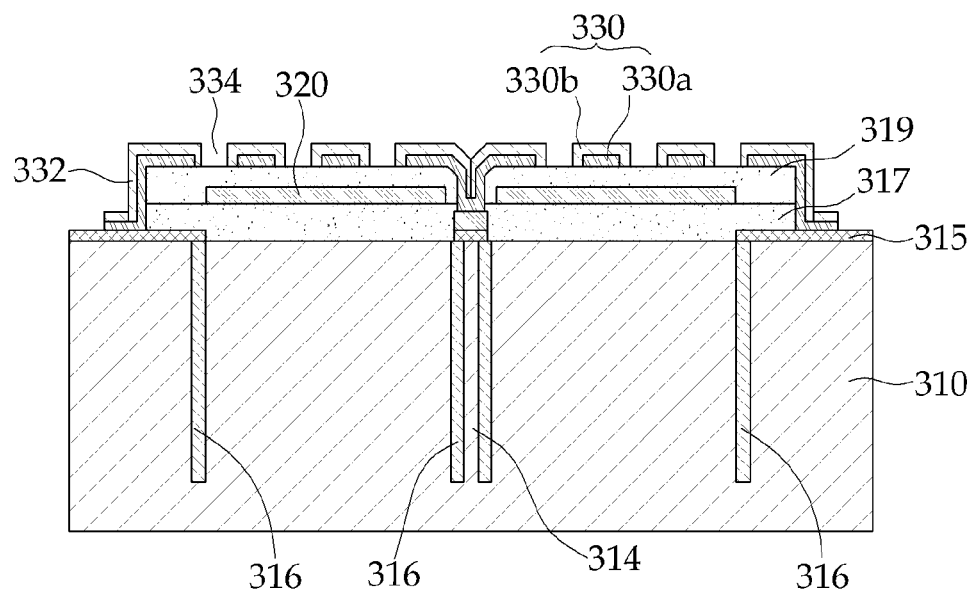

Referring to FIG. 8I, a metal 330a is deposited and patterned on the substrate 310 where the second sacrificial layer 319 is formed, and the fixed electrode 330 having a plurality of exhaust holes 334 is formed by depositing an insulation layer 330b on the patterned metal 330a. In this case, a fixed electrode/substrate connector 332 connecting the fixed electrode 330 and the substrate 310 is formed together.

Figure 8J:
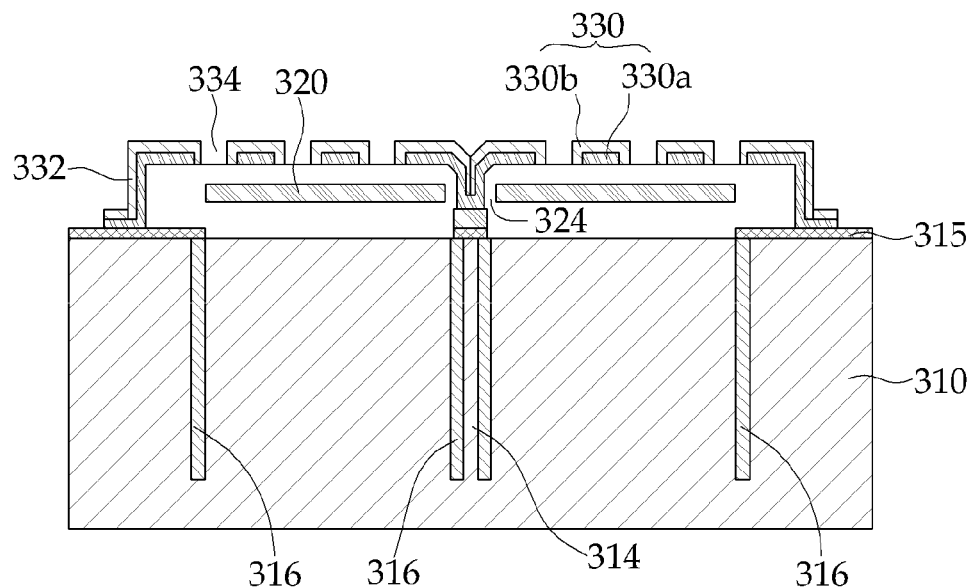

Referring to FIG. 8J, the first sacrificial layer 317 and the second sacrificial layer 319 are removed through drying etching or wet etching. Accordingly, the vibrating plate 320 is formed to be spaced apart from the substrate 310 by a predetermined interval, and the fixed electrode 330 is formed to be spaced part from the vibrating plate 320 by a predetermined interval. The fixed electrode 330 and the fixed electrode support 314 are connected to each other through the exhaust hole 324 formed in the vibrating plate 320.

Figure 8K:
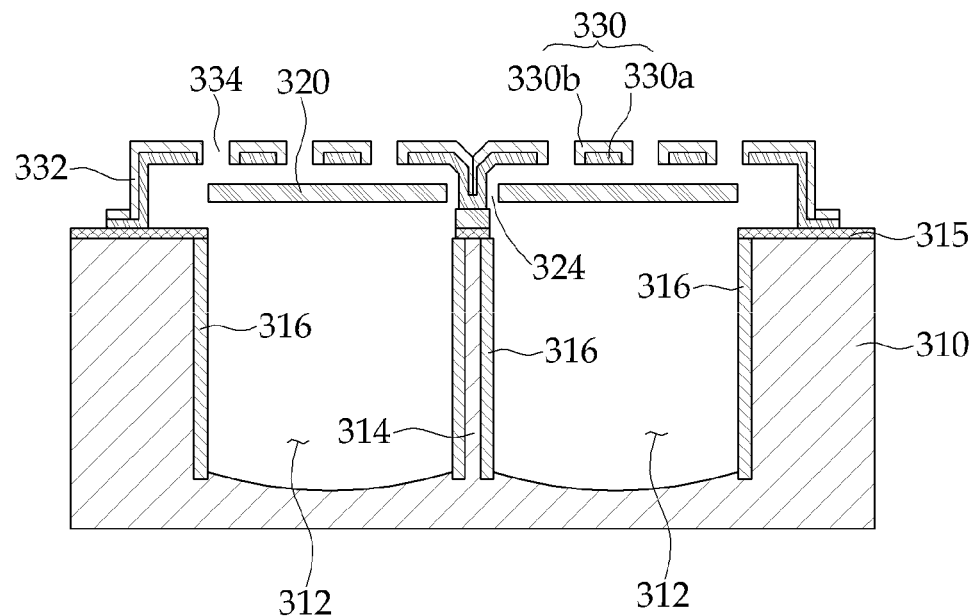

Referring to FIG. 8K, the rear acoustic chamber 312 is formed by isotropic-etching the substrate 310 under the vibrating plate 320 to finish the surface machined MEMS microphone. In this case, when the substrate 310 is etched, the substrate 310 can be selectively etched by the etching preventing wall 316.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A MEMS microphone comprising:
a substrate;
a rear acoustic chamber formed inside a front surface of the substrate;
a vibrating plate formed on the substrate and having an exhaust hole;
a fixed electrode formed on the vibrating plate; and
a fixed electrode support supported by a bottom of the rear acoustic chamber and connected to the fixed electrode through the exhaust hole.

2. The MEMS microphone of claim 1, wherein the vibrating plate is formed at the same height as an upper surface of the substrate or is formed to be spaced apart from the substrate at a predetermined interval.

3. The MEMS microphone of claim 1, wherein the vibrating plate is connected to the substrate by using a vibrating plate/substrate connector formed at an outer periphery thereof.

4. The MEMS microphone of claim 1, wherein the fixed electrode is formed to be spaced part from the vibrating plate at a predetermined interval.

5. The MEMS microphone of claim 1, wherein the fixed electrode is connected to the substrate by using a fixed electrode/substrate connector formed at an outer periphery thereof.

6. The MEMS microphone of claim 1, wherein a diameter of the exhaust hole is larger than a diameter of a cross-section of the fixed electrode support.

7. The MEMS microphone of claim 1, wherein etching preventing walls are formed on an outer wall of the fixed electrode support and an inner wall of the rear acoustic chamber.

8. The MEMS microphone of claim 7, wherein the etching preventing wall is any one of an oxide film, a nitride film and a metal.

9. The MEMS microphone of claim 1, wherein the fixed electrode includes a metal and an insulation film.

10. A MEMS microphone comprising:
a substrate;
a rear acoustic chamber formed inside a front surface of the substrate;
a vibrating plate formed on the substrate and having a plurality of exhaust holes;
a fixed electrode formed on the vibrating plate; and
a plurality of fixed electrode supports supported by a bottom of the rear acoustic chamber and connected to the fixed electrode through the plurality of exhaust holes.

11. The MEMS microphone of claim 10, wherein diameters of the exhaust holes are larger than diameters of cross-sections of the fixed electrode supports.

12. The MEMS microphone of claim 10, wherein etching preventing walls are formed on outer walls of the fixed electrode supports and an inner wall of the rear acoustic chamber.

13. The MEMS microphone of claim 12, wherein the etching preventing wall is any one of an oxide film, a nitride film and a metal.

* * * * *